United States Patent [19]

Conforti et al.

[11] 3,932,850

[45] Jan. 13, 1976

[54] WARNING DEVICE

[75] Inventors: Frederick J. Conforti, Aurora; Clifford E. Mensing, Glen Ellyn, both of Ill.

[73] Assignee: Pittway Corporation, Northbrook, Ill.

[22] Filed: Jan. 22, 1975

[21] Appl. No.: 543,145

[52] U.S. Cl. .............................. 340/237 S; 307/232

[51] Int. Cl.[2] ...................... G08B 17/10; H03K 5/20

[58] Field of Search ......... 340/237 S; 250/370, 381, 250/382, 384, 385, 389, 390, 573; 307/232; 328/1

[56] References Cited

UNITED STATES PATENTS

| | | | |
|---|---|---|---|
| 3,516,083 | 6/1970 | Meyer | 340/237 S |
| 3,548,205 | 12/1970 | Ogden | 340/237 S UX |
| 3,611,335 | 10/1971 | Ogden et al. | 340/237 S X |
| 3,876,999 | 4/1975 | Lee | 340/237 S |
| 3,879,718 | 4/1975 | Roberts | 340/237 S X |

*Primary Examiner*—Donald J. Yusko
*Assistant Examiner*—Daniel Myer
*Attorney, Agent, or Firm*—Gary, Juettner, Pyle & Cullinan

[57] ABSTRACT

An improved warning device having means for sensing or detecting a predetermined danger or phenomenon has a compensation circuit for the sensing means, including compensating means connected to the sensing means, amplifier means connected to the junction of the sensing and compensating means, and a feed-back circuit connected to the output of the amplifier means and the input of the compensating means for maintaining the output voltage of the amplifier means substantially constant despite slowly occurring changes in the voltage drop across the sensing means. Means, such as a resistance-capacitance network, is provided in the feedback circuit for rendering the amplifier means non-responsive to slowly occurring changes in the voltage drop across the sensing means and for maintaining the amplifier means responsive to rapidly occurring changes in the voltage drop across the sensing means, as occurs in the presence of the danger or phenomenon to be detected.

14 Claims, 1 Drawing Figure

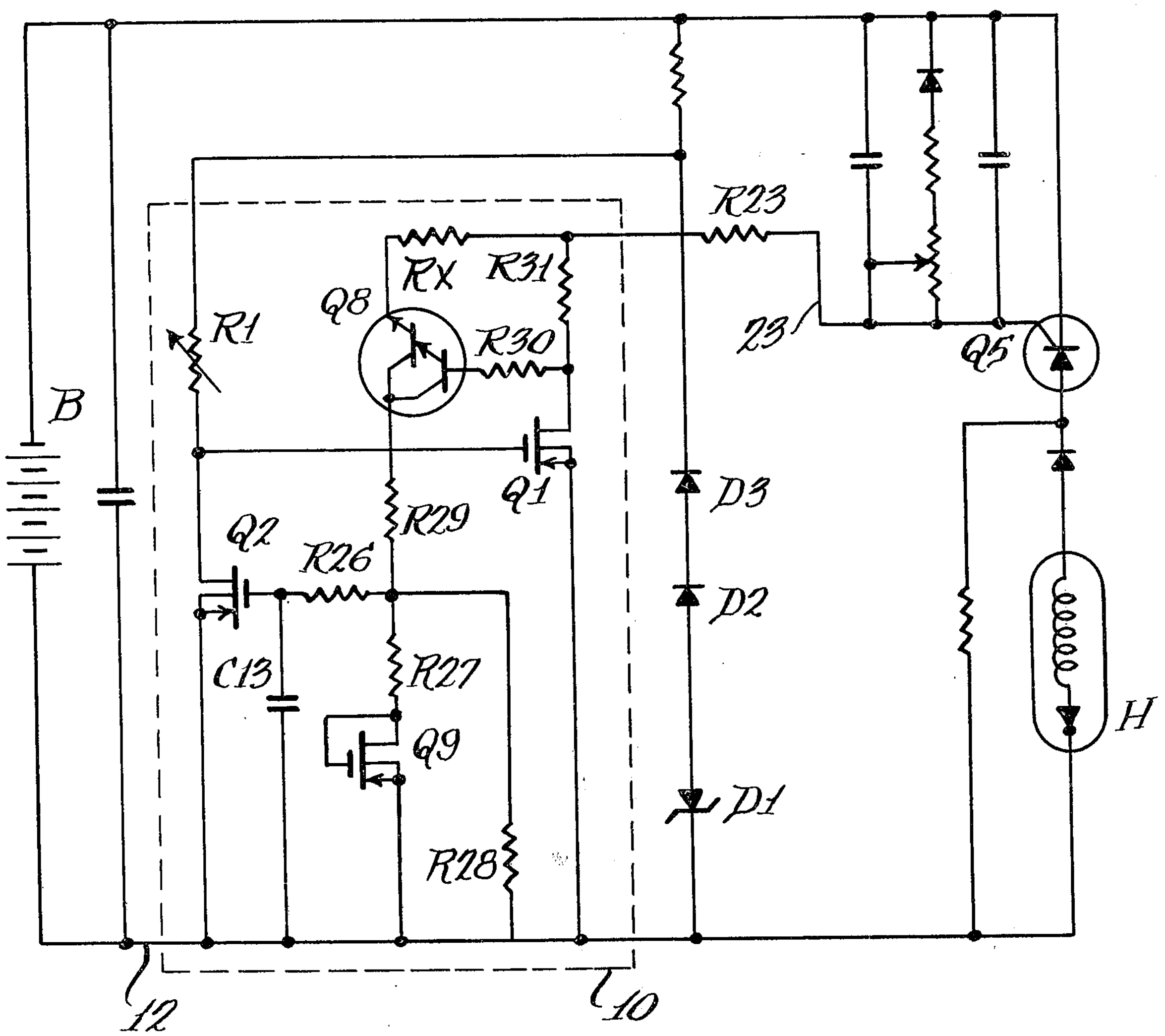
R23
Rx
R31
Q8
R1
R30
23
Q5
B
Q1
D3
R29
Q2
R26
D2
C13
R27
H
Q9
D1
R28
12
10

WARNING DEVICE

BACKGROUND

1. Field of Invention

This invention relates generally to warning devices, and especially to fire or smoke detectors employing sensing or detecting devices responsive to changes in the ambient atmosphere produced by the products of combustion. The invention particularly provides an electronically compensated, rate-of-change sensing device which is non-responsive to slow changes in natural conditions, such as changes in the relative humidity or the pressure of the ambient air, while maintaining the device fully responsive to rapid changes, such as occur in the ambient air due to combustion.

2. Prior Art

Several techniques for compensating rate-of-change sensing devices are known. One such system utilizes a pair of similar sensing devices connected in a bridge circuit. One of the sensing devices is constructed to allow a free flow of air thereto, whereas the other sensing device is shielded to restrict or prevent the flow of air thereto. In the event of a slowly occurring change in an atmospheric condition, both sensors respond similarly so that the changes detected by the sensors effectively cancel each other. In the event of a rapidly occurring change, as in the event of fire, the unshielded sensor responds more rapidly than the shielded sensor, and a warning signal will be provided.

Another compensating system, described in U.S. Pat. No. 3,548,205, issued Dec. 15, 1970, to Wilbur L. Ogden, utilizes a MOSFET transistor connected to the sensing device. The transistor is self-biased and includes a filter capacitor which allows the conductivity of the MOSFET to vary to compensate for slowly occurring changes in the impedance of the detecting device, but prevents compensation of rapidly occurring changes.

Though both these prior techniques provide ways to compensate warning devices for slowly changing parameters sensed by the sensor device, they require the use of individually selected and carefully matched components. The particular sensing device chosen must have electrical characteristics that are compatible with the characteristics of the particular components of the amplification circuitry connected to that sensing device. As can be appreciated selecting and matching the various components for assembly on a production basis is difficult, time consuming and requires considerable skill.

SUMMARY OF THE INVENTION

It is an object of the present invention to provide an improved compensating circuit for sensing devices.

It is a further object of this invention to provide a compensating circuit requiring only minimal matching of components.

Yet another object of this invention is to provide a compensation circuit that provides compensation over broad ranges of the chosen electrical characteristic of the sensing device, such as the voltage drop thereacross.

Still another object of the invention is to provide a compensating circuit that has increased sensitivity to small, rapid, but critical, changes.

In accordance with a preferred embodiment of the invention, a sensing device, such for example as a resistance grid combustion sensor, is connected to the input of a sensing amplifier. A compensating transistor is also connected to the sensing device to provide compensating means for the sensing device. A feedback circuit, preferably comprising a Darlington connected transistor pair and a resistance-capacitance low pass network, is connected between the output of the sensing amplifier and the gate of the compensating transistor to provide a negative feedback path. Slowly occurring changes in the resistance of the sensing device which cause a change in the output voltage of the sensing amplifier are fed back through the feedback network to the compensating transistor to thereby change the conductivity thereof to compensate for the slowly occurring change in the resistance of the sensing device. The low pass network or filter in the feedback circuit prevents rapidly occurring voltage changes, produced by the sensor in the presence of products of combustion, from being fed back to the compensating transistor, thereby effectively preventing the compensation of rapidly occurring changes to maintain full sensitivity to the small but rapid changes in conductivity caused by products of combustion. In order to minimize the current drain of the system, in a quiescent state, another transistor provides a regulated bias voltage source for the compensating transistor which draws a very low current.

DESCRIPTION OF THE DRAWING

In the drawing:

The single FIGURE is a schematic diagram of a fire detecting system utilizing the compensation circuit according to the present invention.

DETAILED DESCRIPTION

Referring to the drawing, and more particularly to the circuitry contained within the boundaries of the dotted line 10, variable resistor R1 comprises a resistance grid sensing device, transistor Q1 comprises a sensing amplifier that provides an output voltage representative of the resistance of the grid R1, and transistors Q2, Q8, Q9 and associated components provide a compensating circuit for the grid R1.

The sensing means R1 may comprise any device which produces variations in an electrical characteristic, such as a change in the voltage drop thereacross, upon exposure to a predetermined change or phenomenon to be detected and which operates on a response, such as rate-of-change. In the illustrated embodiment, the circuit is designed to cause the sensing means to detect the rate of change of products of combustion in the ambient air. The sensor comprises a variable impedance means which includes a grid of conductive paths, freely open to the atmosphere and mounted on a substrate of insulating material, such as glass. For a detailed disclosure of the resistance grid, see U.S. Pat. No. 3,594,751. As explained in that patent, the surface resistivity of the insulating substrate, and hence the resistance between the terminals of the grid R1, varies as a function of the conductivity of the ambient air. For example, for the grid R1, the resistance can vary from a maximum value of approximately $10^{13}$ ohms to a minimum value of approximately $10^5$ ohms. Among the factors that influence the surface resistivity of the substrate are the products of combustion, such as water vapor and particulate matter. However, such a grid is also responsive to ordinary or usually expected changes in the ambient atmosphere, such as changes in relative humidity and the accumulation of dirt or smog. For this reason, the device is designed to operate on a rate of change basis and therefore must be compensated to respond only to rapid changes, such as occur with combustion, and not to slowly occurring changes, such as occur with changes in ambient condition.

It is the purpose of the circuit comprised of transistors Q2, Q8, Q9 and associated components to provide such compensation. The transistors Q2 and Q9, and also Q1 are preferably MOSFET transistors. The transistor Q1, Q2 and Q9 are an amplifying transistor, a compensating transistor, and a biasing transistor, respectively. The transistor Q8 serves as a feedback transistor and is preferably a Darlington amplifier pair.

Referring again to the drawing, one side of the resistance grid R1 is connected to a source of negative potential, comprising diodes D1, D2 and D3. The other side of the grid resistance R1 is connected to a source of reference potential via the drain to source path of the transistor Q2 and the common potential line or conductor 12. The amplifier transistor Q1 has an input or gate electrode connected to the junction of the resistance grid R1 and the drain electrode of the compensating transistor Q2. The source of the transistor Q1 is connected to the common potential line 12, and the drain thereof is connected to one side of a load resistor R31 and to the input of the feedback transistor Q8, via a resistor R30. The output of the Darling transistor Q8 is connected to the gate of the compensating transistor Q2, via resistors R29 and R26. The other electrode of the Darlington transistor Q8 may be connected through a resistor R*x* to the other side of resistor R31, the provision of resistor R*x* serving to reduce the gain of the feedback circuit and prevent possible oscillations thereof. A capacitor C13 is connected between the common potential line 12 and the gate of the transistor Q2, and thus in parallel with the source to gate path of the transistor Q2.

The biasing transistor Q9 has its source to drain path connected in series with a resistor 27, both being between the junction of resistors R26 and R29 and the common line 12 with the resistor R27 being adjacent the junction of R26 and R29. The gate of transistor Q9 is connected to its drain.

A bleed off resistor R28 is also connected between the junctions of R26, R27, and R29 and the common line 12.

In operation, when the circuit is initially energized, the capacitor C13 is completely discharged and the transistor Q2 is rendered substantially non-conductive. As a result, the voltage at the junction of the resistance grid R1 and the transistor Q2 is sufficiently negative to render the transistor Q1 substantially conductive. Rendering the transistor Q1 conductive causes current to flow through the resistor R31. The current flowing through resistor R31 causes a voltage of sufficient magnitude to appear across resistor R31 to render the transistor Q8 conductive. Rendering the transistor Q8 conductive allows current to flow through the resistor R*x*, transistor Q8, and resistors R29 and R26 to charge the capacitor C13. As the capacitor C13 is charged, the voltage appearing at the gate of transistor Q2 gradually becomes more negative, thereby tending to render the transistor Q2 conductive. As transistor Q2 is rendered conductive, transistor Q1 will be rendered less conductive, thereby rendering transistor Q8 less conductive and reducing the charging current applied to the capacitor C13. As capacitor C13 continues to charge, the transistor Q1 is gradually turned off and transistor Q2 is gradually turned on until a quiescent point or state is reached where the current flowing through the resistor R31 is insufficient to turn on the transistor Q8. At the quiescent point, the total current drawn by the circuit is generally less than 10 microamperes and possibly less than one microampere, depending upon the resistance of the grid R1 and the valve of R31.

As was mentioned, the biasing transistor Q9 has its source electrode connected to the common potential line 12 and its gate and drain electrodes connected together to cause a relatively low fixed voltage (known as the knee voltage) to appear between the source and drain electrodes in response to current flow therethrough. The voltage appearing at the drain of the transistor Q9 is applied to the gate of the compensating transistor Q2 via the resistors R27 and R26. The transistor Q9, thus, serves as an efficient regulating bias voltage source for the compensating transistor Q2 in that it provides a relatively constant voltage to the gate of transistor Q2 drawing a minimum current (in the microampere range).

When the resistance of the grid R1 changes slowly as a result of a slowly occurring ambient change to which it is responsive, such as a change in the relative humidity of the ambient air, the voltage at the junction of the grid R1 and the drain electrode of the transistor Q2 tends to change, thereby tending to change the conductivity of the amplifier transistor Q1. Any change in the conductivity of the transistor Q1 causes a change in the amount of current flowing through the resistor R31, thereby changing the conductivity of the feedback transistor Q8. Change in the conductivity of the transistor Q8 changes the amount of charge on the capacitor C13, thereby changing the voltage thereacross, the last mentined voltage causing a change in the conductivity of the compensating transistor Q2 by an amount necessary to compensate for the change in the resistance of the grid R1 to define a new quiescent operating point.

When a fire starts, even in its incipient stage, there is a sudden, sharp increase in the moisture and particulate matter content of the ambient air. These increases cause a sharp reduction in the resistance of the grid R1. The reduction in the resistance of the grid R1 causes the amplifier transistor Q1 to be rendered conductive, thereby rendering the feedback transistor Q8 conductive. However, since the time constant of the resistor R26 and capacitor C13 is chosen to be relatively long, the conductivity of the compensating transistor Q2 will not change sufficiently rapidly to compensate for the change in the resistance of the grid R1, and the transistor Q1 will remain conductive.

The transistor Q1 is connected to the gate of a trigger device, in this embodiment a silicon controlled rectifier or SCR Q5 via resistors R23 and R31. When the transistor Q1 is sufficiently conductive, the current from Q1 applied to the gate of the SCR Q5 cause SCR Q5 to be conductive. Thus, the SCR Q5 serves as a switch to complete the circuit between a source of power, such as a battery B, and an alarm transducer, such as a horn H.

Thus, when a sharp or rapid change occurs in the ambient constituents sought to be detected, a warning signal or alarm is promptly given. However, slowly occurring natural or normal changes do not trigger the alarm (i.e., do not cause a false alarm) because of the functioning of the compensating circuit.

Having thus described what is regarded to be the preferred form of the invention, it should be appreciated that various changes, rearrangements and modifications may be made therein without departing from the scope and spirit of the invention, as defined by the appended claims.

What is claimed is:

1. In a detecting device having a sensor subject to change in its electrical conductivity upon the occurrence of a predetermined condition and to emit a sensible electrical signal upon the occurrence of a given or greater magnitude of change in its conductivity within a period of time, the improvement comprising impedance means controllable between high and low impedance connected in series circuit with said sensor, amplifier means having an input and an output with said input coupled to the junction of said impedance means and said sensor, and a feedback circuit connecting said output of said amplifier means to said impedance means for causing said impedance means to compensate for slow changes in the electrical conductivity of said sensor, said feedback circuit including time delay means for delaying the response of said impedance means to changes in the output of said amplifier means, whereby said sensor can emit a sensible electrical signal second MOSFET transistor having source, drain and gate electrodes with its gate electrode connected to the junction of said sensor and the drain electrode of said first MOSFET transistor, said feedback means including a third transistor comprising a Darlington amplifier pair having its input connected to the drain electrode of said second MOSFET transistor and its output connected to the gate electrode of said first MOSFET transistor.

10. In a device as recited in claim 9, further comprising a third MOSFET transistor having source, drain and gate electrodes with its drain and gate electrodes connected together and connected to the gate electrode of said first MOSFET transistor, said source electrode of said third MOSFET transistor being connected to a current supply for biasing said first MOSFET transistor.

11. In a warning device having a sensor for sensing a predetermined condition and thereupon emitting a signal, amplifier means having an input connected to said sensor and an output for transmitting the amplified signal, and compensating means for said sensor comprising first impedance means controllable from low to high impedance and connected in circuit with said sensor, the improvement comprising feedback means including delay means having a predetermined time an input and an output with said input being connected to the junction of said compensating means and said sensor, and a feedback circuit connecting the output of said amplifier means to said compensating means for causing said impedance means to compensate for changes in the electrical property of said sensor, said feedback circuit including time delay means for delaying the response of said compensating means to changes in the amplifier output, whereby a sensible electrical signal is given only upon the occurrence of said given rate of change of the electrical property.

* * * * *